(12) United States Patent
Ramaraju et al.

(10) Patent No.: US 7,164,293 B2
(45) Date of Patent: Jan. 16, 2007

(54) DYNAMIC LATCH HAVING INTEGRAL LOGIC FUNCTION AND METHOD THEREFOR

(75) Inventors: Ravindraraj Ramaraju, Round Rock, TX (US); George P. Hoekstra, Austin, TX (US); Jeremiah T. Palmer, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 113 days.

(21) Appl. No.: 10/902,204

(22) Filed: Jul. 29, 2004

(65) Prior Publication Data

US 2006/0022714 A1    Feb. 2, 2006

(51) Int. Cl.
*H03K 19/096* (2006.01)
(52) U.S. Cl. .................... 326/98; 326/95; 327/200
(58) Field of Classification Search .............. 326/95, 326/98
See application file for complete search history.

(56) References Cited

U.S. PATENT DOCUMENTS

| | | | | |
|---|---|---|---|---|
| 5,852,373 A | * | 12/1998 | Chu et al. | 326/98 |
| 6,052,008 A | * | 4/2000 | Chu et al. | 327/200 |
| 6,087,872 A | | 7/2000 | Partovi et al. | |
| 6,239,622 B1 | * | 5/2001 | Harris | 326/98 |
| 6,337,584 B1 | * | 1/2002 | Davies et al. | 326/121 |
| 6,570,407 B1 | | 5/2003 | Sugisawa et al. | |

* cited by examiner

*Primary Examiner*—Vibol Tan
(74) *Attorney, Agent, or Firm*—Daniel D. Hill; James L. Clingan, Jr.

(57) ABSTRACT

A circuit (50) that receives dynamic signals performs both logic and latching to achieve high speed operation. The circuit has a clock that defines both an evaluation phase and a precharge phase in which the dynamic signals are evaluated during the evaluation phase. The circuit (50) functions by precharging a latch node (INT) during the evaluation phase then performing evaluation as well during the evaluation phase. The evaluation results in providing a valid logic state to the latch node. A latch circuit (54) latches this valid state during the precharge phase and holds it in this valid state during the precharge phase. This can be adapted to select which one of the dynamic signals is to be coupled and latched on the latch node (INT).

20 Claims, 3 Drawing Sheets

DYNAMIC LATCH HAVING INTEGRAL LOGIC FUNCTION AND METHOD THEREFOR

FIELD OF THE INVENTION

This invention relates generally to integrated circuits, and more particularly to a dynamic latch having an integral logic function.

RELATED ART

Combinational logic circuits are used in many integrated circuit designs. In a complex combinational logic circuit, each part of the circuit introduces at least one gate delay to a signal being routed through the circuit. If the complex combinational logic circuit is used in a critical timing path of an integrated circuit, too many gate delays may slow operation of the integrated circuit by an unacceptable amount. Therefore, it would be desirable to reduce the number of gate delays in the critical timing path of the combinational logic of some integrated circuits.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Figure 1:
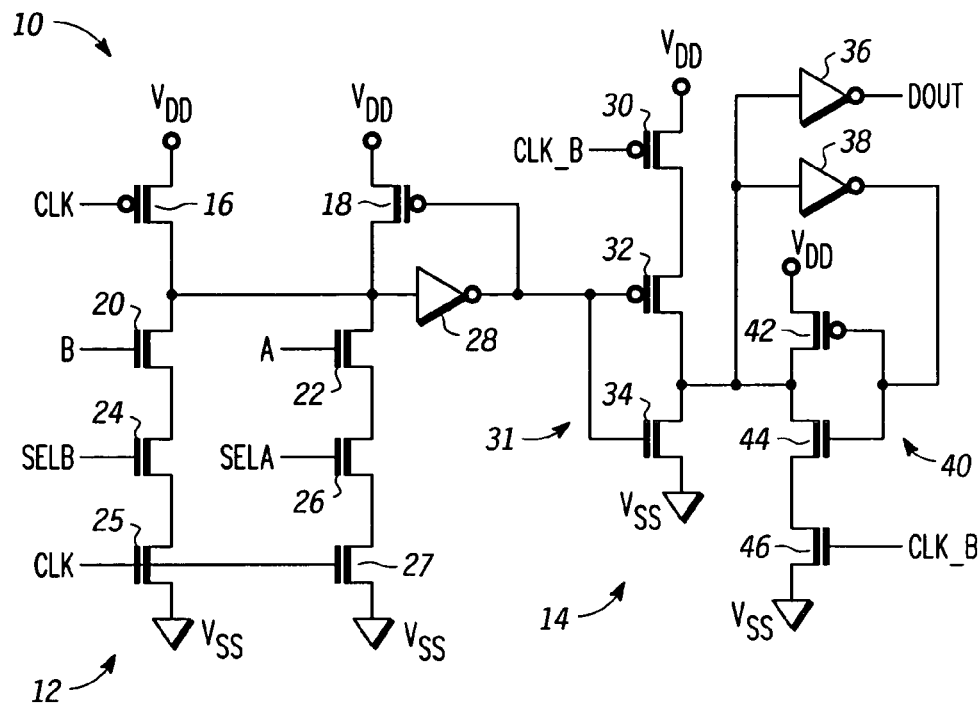
FIG. 1 illustrates, in schematic diagram form, a prior art dynamic multiplexer and latch circuit.
Figure 2:
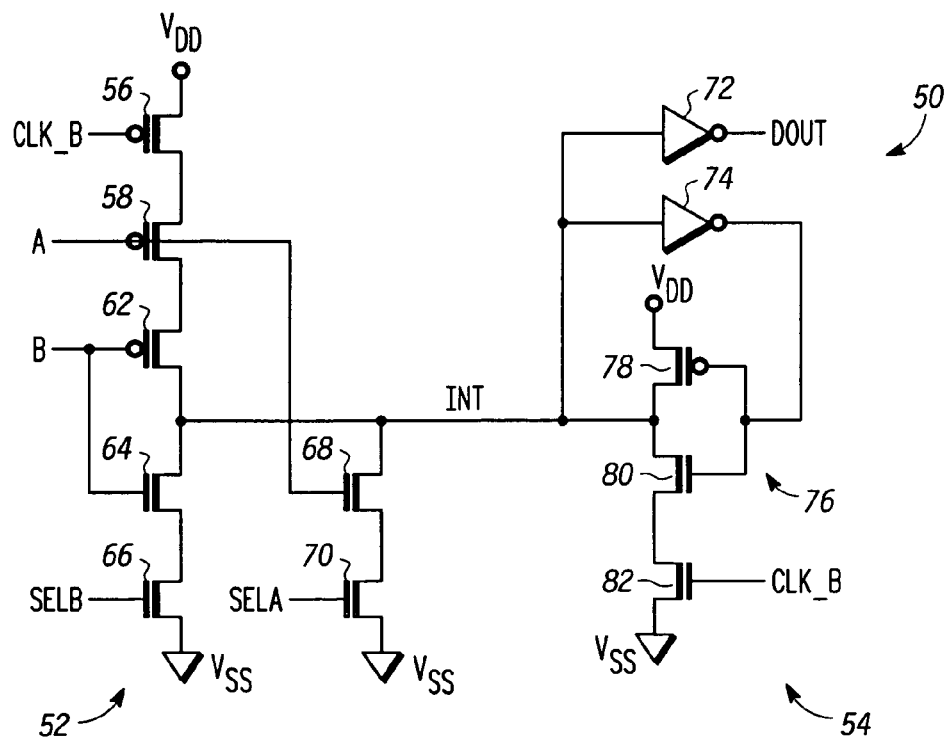
FIG. 2 illustrates, in schematic diagram form, a dynamic multiplexing latch circuit in accordance with one embodiment of the present invention.
Figure 3:
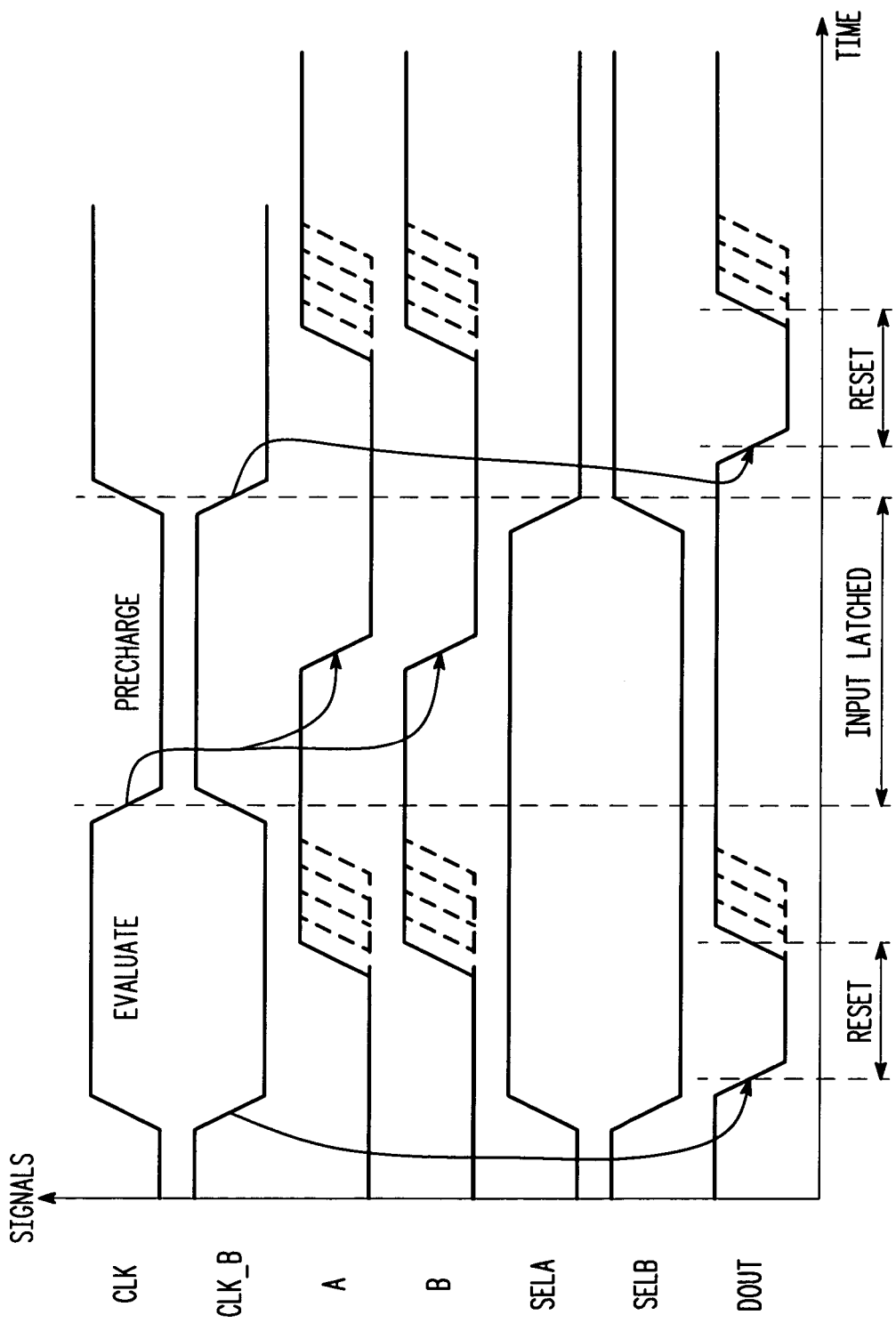
FIG. 3 illustrates a timing diagram of the dynamic multiplexing latch circuit of FIG. 2.
Figure 4:
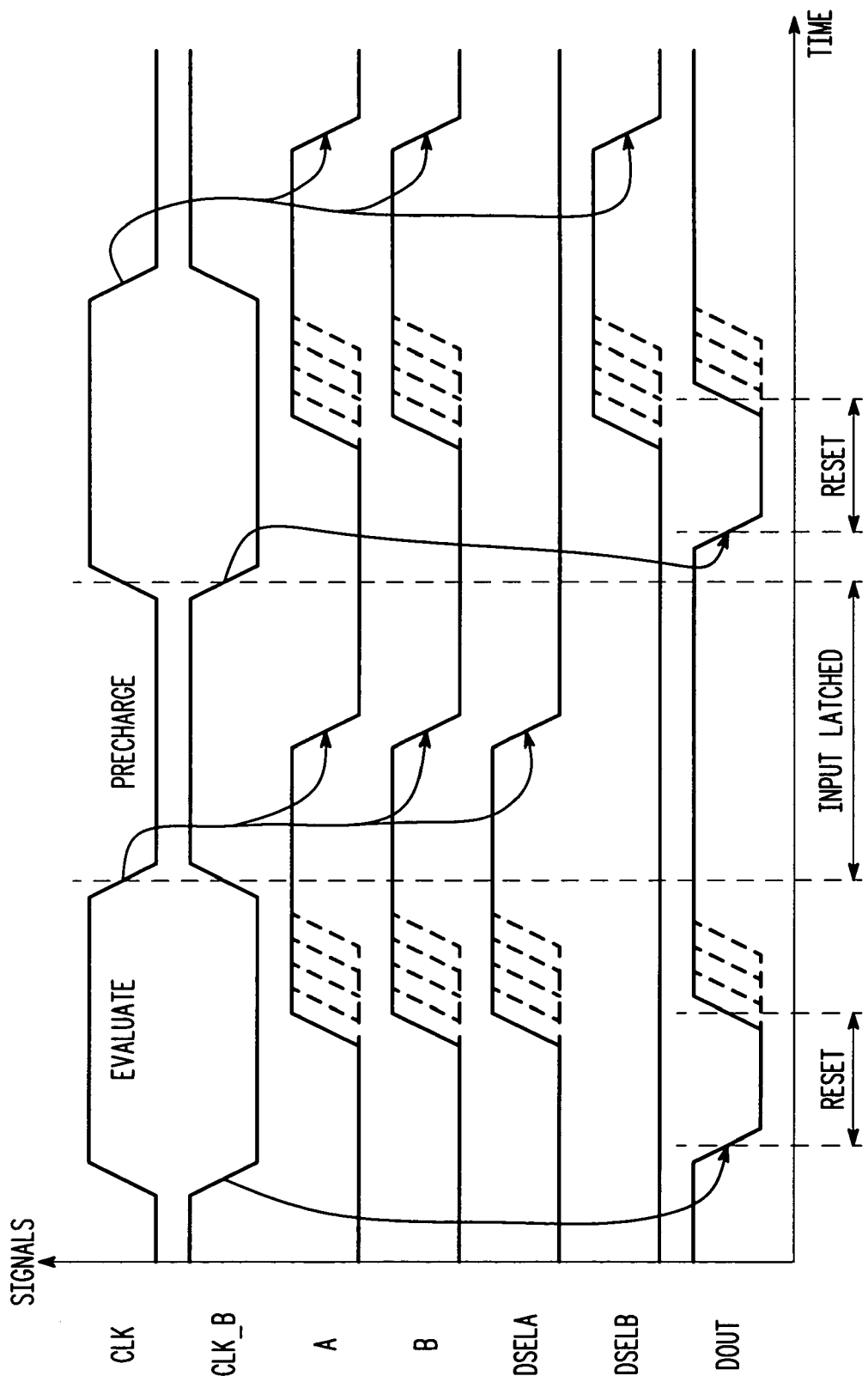
FIG. 4 illustrates a timing diagram of the dynamic multiplexing latch circuit of FIG. 2.

Generally, in one embodiment as illustrated in FIG. 2, the present invention provides a dynamic latch circuit, that combines a logic function with a latching function. The dynamic latch circuit has only one internal node to precharge and evaluate instead of the two internal nodes as required by the prior art circuit shown in FIG. 1 which provides separate logic and latch circuits. Also, the dynamic latch circuit combines its own evaluate and precharge states into one phase designated as "Evaluate" of a single clock signal as illustrated in FIG. 3 and FIG. 4. In addition, the dynamic latch circuit uses fewer transistors than the prior art circuit of FIG. 1. Combining the precharge and evaluate states in the same clock phase allows the result of the evaluated logic function to be held during the entire precharge phase. Also, reducing the number of gate delays in the latch circuit provides for faster operation and may provide for lower power consumption because of the fewer gates that switch.

Logic circuits are sometimes classified as being either static or dynamic. In general, in a static logic circuit, the output has a low resistive path between VDD and VSS. In contrast, operation of a dynamic circuit depends on the temporary storage of signal values on the capacitance of high impedance circuit nodes. To function properly, a static latch circuit needs specific setup and hold times of its input relative to a clock signal. A dynamic circuit only needs the clock signal to reset the output to an initial state. Dynamic circuits offer several advantages over their static counterparts. For example, a dynamic circuit has less front end loading which allows faster switching time and smaller devices. Also, the dynamic circuit will use fewer transistors. In addition, the dynamic circuit does not require that specific setup and hold times to be defined.

FIG. 1 illustrates, in schematic diagram form, a prior art dynamic multiplexing latch circuit 10. Dynamic multiplexing latch circuit 10 includes a multiplexer 12 and a latch 14. Multiplexer 12 includes P-channel transistors 16 and 18, N-channel transistors 20, 22, 24, 25, 26, and 27, and inverter 28. Latch circuit 14 includes a clocked inverter 31, clocked inverter 40, and inverters 36 and 38. Clocked inverter 31 includes P-channel transistors 30 and 32 and N-channel transistor 34. Clocked inverter 40 includes P-channel transistor 42 and N-channel transistors 44 and 46.

Multiplexer circuit portion 12 receives a clock signal labeled "CLK" at the gates of transistors 16, 25, and 27. Input signals labeled "A" and "B" are provided to the gates of transistors 22 and 20, respectively. Input signal A and B are data signals from the output of a preceding circuit. For example, data signals A and B may be the output of a memory or the result of a logical operation. Select signals labeled "SELA" and "SELB" control which of signals A and B will be provided to the input of inverter 28.

Latch circuit portion 14 is coupled to receive and store the output of inverter 28. A clock signal labeled "CLK_B" is provided to the gates of transistors 30 and 46. Clock signals CLK and CLK_B are complementary signals. Inverter 31 provides an output signal in response to an input from inverter 28 when clock signal CLK_B is a logic low. The logic state from the output of inverter 31 is latched by cross-coupled inverters 38 and 40. Inverter 36 is provided to change the logic state of the output of the cross-coupled inverters to equal the logic state of the input.

In latch circuit 10, there are two internal nodes that are precharged and then evaluated. The first internal node is at the input of inverter 28 and is precharged high when clock signal CLK is low. The second internal node is at the output of the clocked inverter 40 and is precharged when clock signal CLK becomes a logic high. The evaluation phase begins when the clock signal CLK transitions to a logic high. A selected one of inputs A and B is allowed to propagate through the multiplexer portion 12 to the latch portion 14 depending on select signals SELA and SELB. The length of time required to propagate through depends on the number of gate delays. If latch circuit 10 is used in a critical timing path of an integrated circuit, the number of gate delays during the evaluate phase may cause too much delay.

FIG. 2 illustrates, in schematic diagram form, a dynamic multiplexing latch circuit 50 in accordance with one embodiment of the present invention. Multiplexing latch circuit 50 includes a multiplexer portion 52 and a latch portion 54. Multiplexer portion 52 includes P-channel transistors 56, 58, and 62 and N-channel transistors 64, 66, 68, and 70. Latch portion 54 includes P-channel transistor 78, N-channel transistors 80 and 82, and inverters 72 and 74. P-channel transistor 78 and N-channel transistors 80 and 82 form a clocked inverter 54.

In multiplexer portion 52, the P-channel transistor 56 has a source coupled to a power supply voltage terminal labeled "VDD", a gate for receiving a clock signal labeled "CLK_B", and a drain. The clock signal CLK_B is active at a logic low. A plurality of series-connected transistors is coupled between the drain terminal of transistor 56 and an internal latch node labeled "INT". In FIG. 2, the plurality of series-connected transistors is represented by P-channel transistors 56, 58 and 62. P-channel transistor 58 has a source coupled to the drain P-channel transistor 56, a gate for receiving an input signal labeled "A", and a drain. P-channel transistor 62 has a source coupled to the drain of P-channel transistor 58, a gate for receiving an input signal labeled "B", and a drain coupled to internal latch node INT. The input signals A and B are generated by circuitry not shown in FIG. 2 and are characterized as being dynamic signals. A plurality of series-connected transistors is coupled between the node INT and VSS as represented by transistors 68 and 70. N-channel transistor 68 has a drain coupled to the node INT, a gate for receiving the input signal A, and a source. N-channel transistor 70 has a drain coupled to the source of transistor 68, a gate for receiving a select signal labeled "SELA", and a source coupled to a power supply voltage terminal labeled "VSS". N-channel transistors 64 and 66 are also coupled between the node INT and VSS. N-channel transistor 64 has a drain coupled to the node INT, a gate coupled to the gate of P-channel transistor 62 for receiving the input signal B, and a drain. An N-channel transistor 66 has a drain coupled to the source of N-channel transistor 64, a gate for receiving a select signal labeled "SELB", and a source coupled to VSS. In the illustrated embodiment, VDD is coupled to receive a positive power supply voltage and VSS is coupled to ground. In other embodiments, VDD and VSS may be coupled to receive other power supply voltages.

Latch portion 54 has input and output terminals coupled to node INT, and an output terminal. In latch portion 54, inverter 72 has an input terminal coupled to node INT and an output terminal for providing an output signal labeled "DOUT". Inverter 72 functions to logically invert and buffer the logic state stored on node INT. Inverter 74 has an input terminal coupled to the node INT, and an output terminal. Inverter 76 includes P-channel transistor 78 and N-channel transistor 80. P-channel transistor 78 has a source coupled to VDD, a gate coupled to the output of inverter 74, and a drain coupled to the node INT. N-channel transistor 80 has a drain coupled to the node INT, a gate coupled to the output of inverter 74, and a source. N-channel transistor 82 has a drain coupled to the source of transistor 80, a gate for receiving the clock signal CLK_B, and a source coupled to VSS. N-channel transistor 82 functions to clock the operation of inverter 76.

FIG. 3 illustrates a timing diagram of the dynamic multiplexing latch circuit 50 of FIG. 2. The operation of latch circuit 50 will be described with reference to both FIG. 2 and FIG. 3.

In operation, the clock signal CLK_B is provided to the gates of P-channel transistor 56 and N-channel transistor 82 and is a logical complement of the clock signal CLK. Note that clock signal CLK is not used directly by circuit 50, but is illustrated in FIG. 3 because the timing of input signals A and B are based on clock signal CLK. An evaluate phase is defined by clock signal CLK being a logic high and a precharge phase is defined by clock signal CLK being a logic low. As illustrated in FIG. 3, the evaluate phase begins when clock signal CLK_B transitions to a logic low state. The precharge phase begins when clock signal CLK_B transitions to a logic high state. During the evaluate phase, internal node INT is pulled high when input signals A and B and clock signal CLK_B are a logic low causing transistors 56, 58, and 62 to be conductive and causing N-channel transistors 64 and 68 to be non-conductive. In FIG. 3, the input signals A and B are dynamic signals and the select signals SELA and SELB are static signals. During the evaluate phase, one, both, or none of the input signals A and B will transition from the initial logic low state to a logic high state. Also, during the evaluate phase, prior to the assertion of input signal A or B, the output DOUT of latch portion 54 is reset to a logic low. One of the select signals SELA and SELB will make its corresponding transistor, either transistor 70 or 66, conductive. In the embodiment illustrated in FIG. 3, select signal SELA becomes a logic high causing N-channel transistor 70 to become conductive. The voltage of the internal node INT can then be pulled low to VSS through the selected select transistor if the corresponding input signal is a logic high. If the selected input signal is a logic low, internal node INT will not be pulled low because a conductive path to VSS will not exist. The output signal DOUT will change logic states in response to internal node INT changing logic states during the precharge phase. The output signal DOUT is latched in the cross-coupled latch comprising inverters 74 and 76 when clock signal CLK_B becomes a logic high. The output signal DOUT is reset when clock signal CLK_B transitions to a logic low. Input signals A and B are both reset to logic low states in response to a falling edge of clock signal CLK.

Latch circuit 50 provides the advantage of fewer gate delays when an input signal is transmitted from the gate of one of the input transistors of multiplexer portion 52 to the output of inverter 72 during the evaluation phase as compared to latch circuit 10. Also, latch circuit 50 has fewer transistors than latch circuit 10. In addition, because fewer transistors are switching, latch circuit 50 will use less power than latch circuit 10.

FIG. 4 illustrates a timing diagram of an alternate embodiment of the dynamic multiplexing latch circuit 50 of FIG. 2. In FIG. 4, the static select signals SELA and SELB, as illustrated in FIGS. 2 and 3, are replaced with dynamic select signals DSELA and DSELB. The operation of the latch circuit 50 remains unchanged except that the select signal that becomes a logic high during the evaluate phase is reset by a falling edge of clock signal CLK.

While the invention has been described in the context of a preferred embodiment, it will be apparent to those skilled in the art that the present invention may be modified in numerous ways and may assume many embodiments other than that specifically set out and described above. For example, in other embodiments of the present invention, the multiplexer portion 52 may be replaced with another logic function, such as for example, an OR logic gate and an AND. In FIG. 2, removing select transistors 66 and 70 and coupling the sources of transistors 64 and 68 to VSS produces a latch circuit having an integral logical OR function.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A circuit having first and second dynamic signals responsive to a clock signal, comprising:
    a first plurality of transistors of a first conductivity type in series coupled between a latch node and a power supply terminal, comprising:
        a first transistor for receiving the first dynamic signal;
        a second transistor for receiving the second dynamic signal;
        a third transistor for receiving a complementary signal that is complementary to the clock signal;
    a second plurality of transistors of a second conductivity type in series coupled between the latch node and a second power supply terminal, comprising;
        a fourth transistor for receiving the first dynamic signal; and
        a fifth transistor for receiving a first select signal;
    a third plurality of transistors of the second conductivity type in series coupled between the latch node and the second power supply terminal, comprising:
        a sixth transistor for receiving the second dynamic signal; and
        a seventh transistor for receiving a second select signal; and
    a latch having an input coupled to the latch node and an output coupled to the latch node.

2. The circuit of claim 1, further comprising an output buffer having an input coupled to the latch node and an output for providing an output of the circuit.

3. The circuit of claim 2, wherein the output buffer comprises an inverter.

4. The circuit of claim 1, wherein the first plurality of transistors are further characterized as being P channel.

5. The circuit of claim 1, wherein the first and second dynamic signals are forced to an inactive state in response to the clock signal switching from a first logic state to a second logic state.

6. The circuit of claim 1, wherein the first select signal is active when the first dynamic signal is to be provided as an output of the circuit and the second select signal is active when the second dynamic signal is to be provided as an output of the circuit.

7. The circuit of claim 1, wherein the latch comprises:
    a first inverter having an input coupled to the latch node and an output; and
    a clocked inverter having an input coupled to the output of the first inverter and an output coupled to the latch node.

8. The circuit of claim 7, wherein the clocked inverter is clocked by the complementary signal.

9. A circuit operating during alternating evaluation and precharge phases, comprising:
    a first plurality of transistors of a first conductivity type in series coupled between a latch node and a power supply terminal, comprising:
        a first transistor for receiving a first dynamic signal that is evaluated during the evaluation phase and reset in response to a transition from the evaluation phase to the precharge phase;
        a second transistor for receiving a second dynamic signal that is evaluated during the evaluation phase and reset in response to a transition from the evaluation phase to the precharge phase;
        a third transistor that is conductive during the evaluation phase and non-conductive during the precharge phase;
    a fourth transistor coupled between the latch node and a second power supply terminal for receiving the first dynamic signal;
    a fifth transistor coupled between the latch node and a second power supply terminal for receiving the second dynamic signal; and
    a latch coupled to the latch node.

10. The circuit of claim 9 wherein the latch node is precharged then evaluated during the evaluation phase and provides a valid logic state during the precharge phase.

11. The circuit of claim 10, further comprising an output buffer having an input coupled to the latch node and an output for providing an output of the circuit.

12. The circuit of claim 10, wherein the first plurality of transistors are further characterized as being P channel and the fourth and fifth transistors are characterized as being N channel.

13. The circuit of claim 10, wherein the latch comprises:
    a first inverter having an input coupled to the latch node and an output; and
    a second inverter having an input coupled to the output of the first inverter and an output coupled to the latch node.

14. The circuit of claim 13, wherein the second inverter is a clocked inverter.

15. The circuit of claim 14, wherein the second inverter is clocked by the complementary clock signal.

16. The circuit of claim 10, wherein:
    the evaluation phase is defined by a true clock being at a first logic state and the precharge phase being defined by the true clock being at a second logic state; and
    the third transistor is conductive and non-conductive in response to a complementary clock that is complementary to the true clock.

17. The circuit of claim 16, wherein the first logic state is a relatively higher voltage than the second logic state.

18. The circuit of claim 10, further comprising:
    a sixth transistor coupled in series with the fourth transistor for receiving a first select signal; and
    a seventh transistor coupled in series with the fifth transistor for receiving a second select signal 19. The circuit of claim 18, wherein the first and second select signals are dynamic signals.

20. The circuit of claim 19, wherein the first select signal is active when the first dynamic signal is to be provided as an output of the circuit and the second select signal is active when the second dynamic signal is to be provided as an output of the circuit.

* * * * *